United States Patent
Liao et al.

(10) Patent No.: US 9,692,007 B2
(45) Date of Patent: Jun. 27, 2017

(54) STACKED ORGANIC LIGHT-EMITTING DIODE HAVING A TRIPLE CHARGE GENERATION LAYER

(71) Applicant: BOE Technology Group Co., Ltd., Beijing (CN)

(72) Inventors: Chin-Lung Liao, Beijing (CN); Chang-Yen Wu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/104,623

(22) PCT Filed: Oct. 13, 2015

(86) PCT No.: PCT/CN2015/091844
§ 371 (c)(1),
(2) Date: Jun. 15, 2016

(87) PCT Pub. No.: WO2016/101679
PCT Pub. Date: Jun. 30, 2016

(65) Prior Publication Data
US 2016/0365533 A1   Dec. 15, 2016

(30) Foreign Application Priority Data
Dec. 24, 2014   (CN) .......................... 2014 1 0815361

(51) Int. Cl.
*H01L 51/52* (2006.01)
*H01L 51/50* (2006.01)
*H01L 51/56* (2006.01)

(52) U.S. Cl.
CPC ...... *H01L 51/5221* (2013.01); *H01L 51/5012* (2013.01); *H01L 51/5072* (2013.01);
(Continued)

(58) Field of Classification Search
CPC ............. H01L 51/5221; H01L 51/5012; H01L 51/5072; H01L 51/5092; H01L 51/52; H01L 51/56
See application file for complete search history.

(56) References Cited

U.S. PATENT DOCUMENTS 7,781,073 B2 * 8/2010 Kijima .................. C09K 11/06
                                                       313/504
8,482,017 B2 * 7/2013 Lee ..................... H01L 51/5278
                                                         257/96
(Continued)

FOREIGN PATENT DOCUMENTS

CN   102067730 A      5/2011
CN   102891260 A  *   1/2013
(Continued)

OTHER PUBLICATIONS

Second Office Action for Chinese Patent Application No. 201410815361.1, dated Oct. 17, 2016, 23 pages.
(Continued)

*Primary Examiner* — Ida M Soward
(74) *Attorney, Agent, or Firm* — Westman, Champlin & Koehler, P.A.

(57) ABSTRACT

A stacked organic light-emitting diode, a display device and a manufacturing method of a stacked organic light-emitting diode are disclosed. A stacked organic light-emitting diode includes at least two light-emitting units in a stacked arrangement and a charge generation layer disposed between the adjacent light-emitting units, wherein the charge generation layer includes a first material layer, an electron injection layer disposed on the first material layer and a second material layer disposed on the electron injection layer. By means of said stacked organic light-emitting diode and manufacturing method thereof, it can achieve excellent electron injection effect, even in the case of manufacturing (Continued)

an inverted-type stacked organic light-emitting diode (the lower electrode is a cathode).

19 Claims, 3 Drawing Sheets

(52) U.S. Cl.
CPC .......... *H01L 51/5092* (2013.01); *H01L 51/52* (2013.01); *H01L 51/56* (2013.01)

(56) References Cited

U.S. PATENT DOCUMENTS

| | | | |
|---|---|---|---|
| 8,581,266 B2* | 11/2013 | Nowatari | H01L 51/5016 257/87 |
| 8,637,854 B2 | 1/2014 | Kang et al. | |
| 8,796,676 B2* | 8/2014 | Pieh | H01L 51/5203 257/40 |
| 8,829,504 B2* | 9/2014 | Song | H01L 51/5044 257/40 |
| 9,276,220 B2* | 3/2016 | Kim | H01L 51/0052 |
| 9,356,249 B2* | 5/2016 | Chang | H01L 51/5008 |
| 9,379,345 B2* | 6/2016 | Seo | H01L 51/504 |
| 2006/0091794 A1* | 5/2006 | Agostinelli | H01L 27/3204 313/506 |
| 2007/0231596 A1 | 10/2007 | Spindler et al. | |
| 2015/0001560 A1* | 1/2015 | Ryden | H01L 27/153 257/88 |
| 2015/0155517 A1* | 6/2015 | Lang | H01L 51/5084 257/40 |
| 2015/0279909 A1* | 10/2015 | Tsuji | H01L 51/504 257/40 |
| 2015/0357596 A1* | 12/2015 | Loebl | H01B 1/04 257/40 |
| 2016/0028038 A1 | 1/2016 | Wu | |
| 2016/0149153 A1* | 5/2016 | Scharner | H01L 51/5206 257/40 |

FOREIGN PATENT DOCUMENTS

| | | |
|---|---|---|
| CN | 103137876 A | 6/2013 |
| CN | 103730586 A | 4/2014 |
| CN | 104051639 A | 9/2014 |
| CN | 104051661 A | 9/2014 |
| CN | 104466023 A | 3/2015 |
| JP | 2010-192719 A | 9/2010 |

OTHER PUBLICATIONS

International Search Report and Written Opinion for International Application No. PCT/CN2015/091844, dated Jan. 27, 2016, 11 pages.

English translation of Box No. V of the Written Opinion from the International Searching Authority for International Application No. PCT/CN2015/091844, which issued Jan. 27, 2016, 2 pages.

First Office Action, including Search Report, for Chinese Patent Application No. 201410815361.1, dated May 6, 2016, 22 pages.

Rejection Decision for Chinese Patent Application No. 201410815361.1, dated Feb. 24, 2017, 29 pages.

* cited by examiner

STACKED ORGANIC LIGHT-EMITTING DIODE HAVING A TRIPLE CHARGE GENERATION LAYER

CROSS-REFERENCE TO RELATED APPLICATION

This application is a Section 371 National Stage Application of International Application No. PCT/CN2015/091844, filed on Oct. 13, 2015, entitled "Stacked Organic Light-Emitting Diode and Manufacturing Method Thereof and Display Device", which claims priority to Chinese Application No. 201410815361.1, filed on Dec. 24, 2014, incorporated herein by reference in their entirety.

BACKGROUND OF THE INVENTION

Field of the Invention

Embodiments of the present disclosure relate to a stacked organic light-emitting diode, a display device and a manufacturing method of a stacked organic light-emitting diode.

Description of the Related Art

It is necessary for a plurality of light-emitting units of a stacked organic light-emitting diode to be connected to each other by a charge generation layer, which may be provided with various material layers, such as a metal layer, a metallic oxide layer, an organic compound layer, or an inorganic compound layer, and the like, in order to generate charge and successfully inject the generated charge into various light-emitting units.

SUMMARY OF THE INVENTION

The embodiments of the present disclosure aim to provide a stacked organic light-emitting diode, a display device and a manufacturing method of a stacked organic light-emitting diode, so as to enable the stacked organic light-emitting diode to achieve excellent electron injection effect.

According to one aspect of the present disclosure, there is provided a stacked organic light-emitting diode, comprising: at least two light-emitting units in a stacked arrangement; and a charge generation layer disposed between the adjacent light-emitting units, wherein the charge generation layer comprises a first material layer, an electron injection layer disposed on the first material layer and a second material layer disposed on the electron injection layer.

By means of such charge generation layer comprising the first material layer, the electron injection layer and the second material layer, it can achieve excellent electron injection effect. Furthermore, based on the stacked organic light-emitting diode according to embodiments of the present disclosure, it can enable the second material layer (for example, a metal layer or a mixed material layer) to react with the electron injection layer when manufacturing the stacked organic light-emitting diode, even in the case of manufacturing an inverted-type stacked organic light-emitting diode (the lower electrode is a cathode), thereby achieving excellent electron injection effect.

According to one aspect of the present disclosure, the first material layer is made of metal material.

According to one aspect of the present disclosure, the second material layer is made of metal material.

According to one aspect of the present disclosure, the first material layer is made of metal material and the second material layer is made of metal material.

Based on the stacked organic light-emitting diode according to embodiments of the present disclosure, since the second material layer is made of metal material, it can enable the second material layer to react with the electron injection layer when manufacturing the stacked organic light-emitting diode, even in the case of manufacturing an inverted-type stacked organic light-emitting diode (the lower electrode is a cathode), thereby achieving excellent electron injection effect.

According to one aspect of the present disclosure, the first material layer is made of a first mixed material, which is formed by mixing at least one first material having a first electrical conductivity and at least one second material having a second electrical conductivity, the first electrical conductivity being greater than the second electrical conductivity.

According to one aspect of the present disclosure, the second material layer is made of a second mixed material, which is formed by mixing at least one third material having a third electrical conductivity and at least one fourth material having a fourth electrical conductivity, the third electrical conductivity being greater than the fourth electrical conductivity.

According to one aspect of the present disclosure, the first material layer is made of a first mixed material, which is formed by mixing at least one first material having a first electrical conductivity and at least one second material having a second electrical conductivity, the first electrical conductivity being greater than the second electrical conductivity, and the second material layer is made of a second mixed material, which is formed by mixing at least one third material having a third electrical conductivity and at least one fourth material having a fourth electrical conductivity, the third electrical conductivity being greater than the fourth electrical conductivity.

According to one aspect of the present disclosure, the first electrical conductivity is greater than $10^3$ S/cm, and the second electrical conductivity is less than $10^{-6}$ S/cm.

According to one aspect of the present disclosure, the third electrical conductivity is greater than $10^3$ S/cm, and the fourth electrical conductivity is less than $10^{-6}$ S/cm.

According to one aspect of the present disclosure, the first electrical conductivity is greater than $10^3$ S/cm, and the second electrical conductivity is less than $10^{-6}$ S/cm, and the third electrical conductivity is greater than $10^3$ S/cm, and the fourth electrical conductivity is less than $10^{-6}$ S/cm.

According to one aspect of the present disclosure, the first material is a metal material and the second material is an organic material.

According to one aspect of the present disclosure, the third material is a metal material and the fourth material is an organic material.

According to one aspect of the present disclosure, the first material is a metal material and the second material is an organic material, and the third material is a metal material and the fourth material is an organic material.

By means of the first material layer made of the first mixed material and/or the second material layer made of the second mixed material, especially when the mixed material consists of metal and organic material, a material layer with good uniformity may be formed, while an affection of a relatively thick material layer on the penetrance and a sideward electrically conducting problem may be avoided.

According to one aspect of the present disclosure, the stacked organic light-emitting diode further comprises an organic layer disposed between the electron injection layer and the second material layer.

According to embodiments of the present disclosure, by means of the organic layer disposed between the electron injection layer and the second material layer, the material of the electron injection layer may be reacted with the material of the organic layer when manufacturing the stacked organic light-emitting diode, thereby generating more excellent electron injection effect.

According to one aspect of the present disclosure, the organic layer is provided with a plurality of through-holes in a thickness direction, such that the second material layer and the electron injection layer are locally directly contacted with each other.

According to one aspect of the present disclosure, the organic layer is made of one chosen from Alq, MADN, TPBi, BCP and BPhen.

According to one aspect of the present disclosure, each of the first material layer and the second material layer has a thickness of less than 3 nm.

According to one aspect of the present disclosure, each of the first material layer and the second material layer has a thickness of approximately 0.5 nm.

According to one aspect of the present disclosure, the first material layer and the second material layer are made of the same material.

According to one aspect of the present disclosure, the first material layer and the second material layer are made of one chosen from Al, Ag, Mg, Au and Li.

According to one aspect of the present disclosure, the electron injection layer has a thickness of approximately 1 nm.

According to one aspect of the present disclosure, the electron injection layer is made of organometallic complex compound or inorganic material.

According to one aspect of the present disclosure, the electron injection layer is made of alkali metal compound.

According to one aspect of the present disclosure, the electron injection layer is made of one chosen from LiF, LiQ, NaF, CsF and $Cs_2CO_3$.

According to one aspect of the present disclosure, the fourth material is an electron transport material.

According to one aspect of the present disclosure, the stacked organic light-emitting diode further comprises: a substrate; a first electrode disposed on the substrate, the at least two light-emitting units in a stacked arrangement being disposed on the first electrode, and the first electrode being a cathode.

According to one aspect of the present disclosure, there is provided a display device, comprising the stacked organic light-emitting diode described above.

By means of such charge generation layer comprising the first material layer, the electron injection layer and the second material layer, it can achieve excellent electron injection effect. Furthermore, based on the stacked organic light-emitting diode according to embodiments of the present disclosure, it can enable the second material layer (for example, a metal layer or a mixed material layer) to react with the electron injection layer when manufacturing the stacked organic light-emitting diode, even in the case of manufacturing an inverted-type stacked organic light-emitting diode (the lower electrode is a cathode), thereby achieving excellent electron injection effect. Thereby, the quality of the display device may be improved.

According to one aspect of the present disclosure, there is provided a manufacturing method of a stacked organic light-emitting diode, comprising steps of: forming a first light-emitting unit; forming a first material layer on the first light-emitting unit; forming an electron injection layer on the first material layer; forming a second material layer on the electron injection layer, the first material layer, the electron injection layer and the second material layer composing a charge generation layer; and forming a second light-emitting unit on the second material layer.

By means of such charge generation layer comprising the first material layer, the electron injection layer and the second material layer, it can achieve excellent electron injection effect. Furthermore, based on the manufacturing method of the stacked organic light-emitting diode according to embodiments of the present disclosure, it can enable the second material layer (for example, a metal layer or a mixed material layer) to react with the electron injection layer when manufacturing the stacked organic light-emitting diode, even in the case of manufacturing an inverted-type stacked organic light-emitting diode (the lower electrode is a cathode), thereby achieving excellent electron injection effect.

According to one aspect of the present disclosure, the first material layer is made of metal material.

According to one aspect of the present disclosure, the second material layer is made of metal material.

According to one aspect of the present disclosure, the first material layer is made of metal material and the second material layer is made of metal material.

According to one aspect of the present disclosure, the manufacturing method of the stacked organic light-emitting diode further comprises a step of: forming an organic layer, on which the second material layer is formed, on the electron injection layer after forming the electron injection layer.

According to embodiments of the present disclosure, by means of forming the organic layer, on which the second material layer is formed, on the electron injection layer after forming the electron injection layer, the material of the electron injection layer may be reacted with the material of the organic layer when manufacturing the stacked organic light-emitting diode, thereby generating more excellent electron injection effect.

According to one aspect of the present disclosure, the first material layer is made of a first mixed material, which is formed by mixing at least one first material having a first electrical conductivity and at least one second material having a second electrical conductivity, the first electrical conductivity being greater than the second electrical conductivity.

According to one aspect of the present disclosure, the second material layer is made of a second mixed material, which is formed by mixing at least one third material having a third electrical conductivity and at least one fourth material having a fourth electrical conductivity, the third electrical conductivity being greater than the fourth electrical conductivity.

According to one aspect of the present disclosure, the first material layer is made of a first mixed material, which is formed by mixing at least one first material having a first electrical conductivity and at least one second material having a second electrical conductivity, the first electrical conductivity being greater than the second electrical conductivity, and the second material layer is made of a second mixed material, which is formed by mixing at least one third material having a third electrical conductivity and at least one fourth material having a fourth electrical conductivity, the third electrical conductivity being greater than the fourth electrical conductivity.

According to one aspect of the present disclosure, the first electrical conductivity is greater than $10^3$ S/cm, and the second electrical conductivity is less than $10^{-6}$ S/cm.

According to one aspect of the present disclosure, the third electrical conductivity is greater than $10^3$ S/cm, and the fourth electrical conductivity is less than $10^{-6}$ S/cm.

According to one aspect of the present disclosure, the first electrical conductivity is greater than $10^3$ S/cm, and the second electrical conductivity is less than $10^{-6}$ S/cm, and the third electrical conductivity is greater than $10^3$ S/cm, and the fourth electrical conductivity is less than $10^{-6}$ S/cm.

According to one aspect of the present disclosure, the first material is a metal material and the second material is an organic material.

According to one aspect of the present disclosure, the third material is a metal material and the fourth material is an organic material.

According to one aspect of the present disclosure, the first material is a metal material and the second material is an organic material, and the third material is a metal material and the fourth material is an organic material.

By means of the first material layer made of the first mixed material and/or the second material layer made of the second mixed material, especially when the mixed material consists of metal and organic material, a material layer with good uniformity may be formed, while an affection of a relatively thick material layer on the penetrance and a sideward electrically conducting problem may be avoided.

According to one aspect of the present disclosure, the organic layer is provided with a plurality of through-holes in a thickness direction, such that the second material layer and the electron injection layer are locally directly contacted with each other.

According to one aspect of the present disclosure, the organic layer is made of one chosen from Alq, MADN, TPBi, BCP and BPhen.

According to one aspect of the present disclosure, each of the first material layer and the second material layer has a thickness of less than 3 nm.

According to one aspect of the present disclosure, each of the first material layer and the second material layer has a thickness of approximately 0.5 nm.

According to one aspect of the present disclosure, the first material layer and the second material layer are made of the same material.

According to one aspect of the present disclosure, the first material layer and the second material layer are made of one chosen from Al, Ag, Mg, Au and Li.

According to one aspect of the present disclosure, the electron injection layer has a thickness of approximately 1 nm.

According to one aspect of the present disclosure, the electron injection layer is made of organometallic complex compound or inorganic material.

According to one aspect of the present disclosure, the electron injection layer is made of alkali metal compound.

According to one aspect of the present disclosure, the electron injection layer is made of one chosen from LiF, LiQ, NaF, CsF and $Cs_2CO_3$.

According to one aspect of the present disclosure, the fourth material is an electron transport material.

According to one aspect of the present disclosure, the stacked organic light-emitting diode further comprises: a substrate; a first electrode disposed on the substrate, the at least two light-emitting units in a stacked arrangement being disposed on the first electrode, and the first electrode being a cathode.

DETAILED DESCRIPTION OF PREFERRED EMBODIMENTS OF THE INVENTION

The embodiments of the present disclosure will be further described in detail below, in combination with the accompanying figures. Furthermore, for the purpose of explanation, many specific details are set forth in the detailed description below to provide a comprehensive understanding for the embodiments. However, obviously, one or more embodiments may be implemented without theses specific details. In other cases, well-known structures and devices are embodied in an illustration manner to simplify the accompanying figures.

Figure 1:
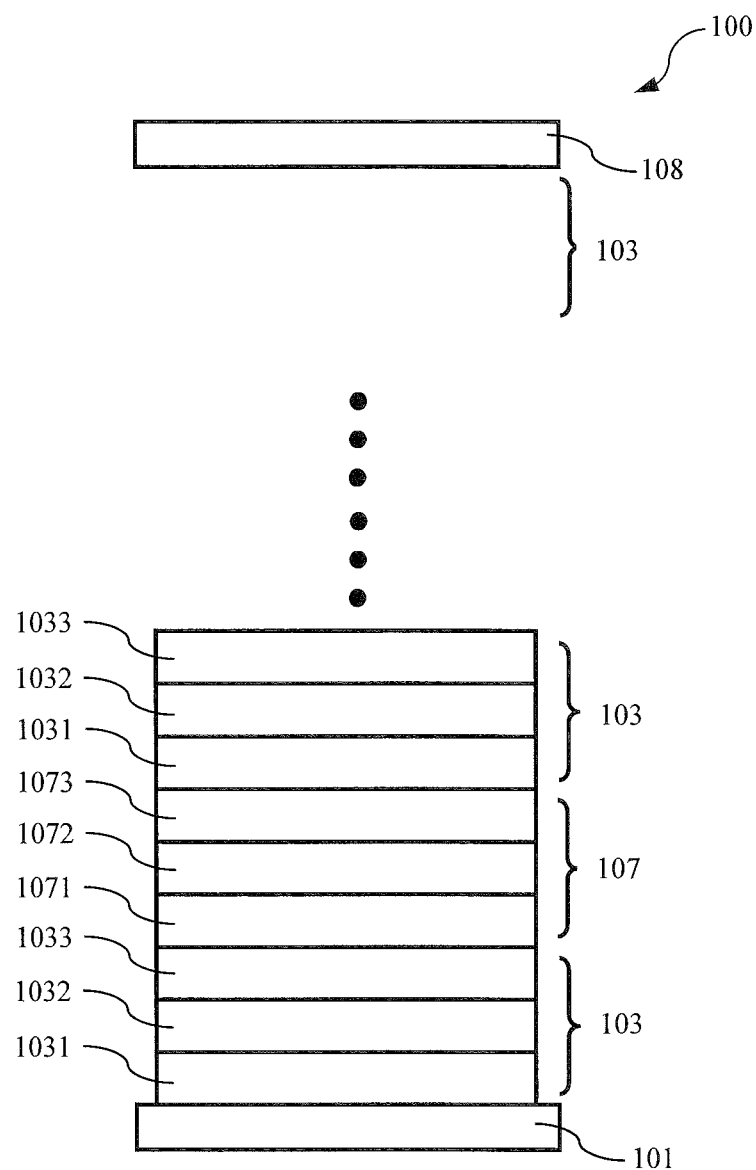
FIG. 1 is a schematic view of a stacked organic light-emitting diode according to an embodiment of the present disclosure.

FIG. 1 shows a stacked organic light-emitting diode according to an embodiment of the present disclosure. As shown in FIG. 1, the stacked organic light-emitting diode 100 according to the embodiment of the present disclosure comprises: at least two light-emitting units 103 in a stacked arrangement; and a charge generation layer 107 disposed between the adjacent light-emitting units 103. The charge generation layer 107 comprises a first material layer 1071, an electron injection layer 1072 disposed on the first material layer 1071 and a second material layer 1073 disposed on the electron injection layer 1072. The first material layer 1071 and the second material layer 1073 may be made of the same or different materials. By means of such charge generation layer 107 comprising the first material layer 1071, the electron injection layer 1072 and the second material layer 1073, it can achieve excellent electron injection effect. As shown in FIG. 1, the stacked organic light-emitting diode 100 according to the embodiment of the present disclosure may further comprise: a substrate (not shown); and a first electrode 101 disposed on the substrate, wherein the at least two light-emitting units 103 are disposed on the first electrode 101. The stacked organic light-emitting diode 100 further comprises a second electrode 108 disposed on the uppermost light-emitting unit 103. The first electrode 101 may be one of a cathode and an anode, while the second electrode 108 may be the other of the cathode and the anode.

According to some embodiments of the present disclosure, at least one of the first material layer 1071 and the second material layer 1073 is made of metal material. For example, the first material layer 1071 and the second material layer 1073 may be made of one chosen from Al, Ag, Mg, Au and Li, or any other suitable material. Based on the stacked organic light-emitting diode according to the embodiment of the present disclosure, since the second material layer 1073 is made of metal material, it can enable the material layer to react with the electron injection layer when manufacturing the stacked organic light-emitting diode, even in the case of manufacturing an inverted-type stacked organic light-emitting diode (the lower electrode is a cathode), thereby achieving excellent electron injection effect.

Optionally, according to other embodiments of the present disclosure, the first material layer 1071 is made of a first mixed material, which is formed by mixing at least one first material having a first electrical conductivity and at least one second material having a second electrical conductivity, wherein the first electrical conductivity is greater than the second electrical conductivity, and/or the second material layer 1073 is made of a second mixed material, which is formed by mixing at least one third material having a third electrical conductivity and at least one fourth material having a fourth electrical conductivity, wherein the third electrical conductivity is greater than the fourth electrical conductivity. The first electrical conductivity may be greater than $10^3$ S/cm or $10^5$ S/cm, and the second electrical conductivity may be less than $10^{-6}$ S/cm, and the third electrical conductivity may be greater than $10^3$ S/cm or $10^5$ S/cm, and the fourth electrical conductivity may be less than $10^{-6}$ S/cm. The first material layer 1071 and the second material layer 1073 form an electrically conductive layer. According to an example of the present disclosure, the weight percentage of the first material in the first mixed material is in a range of 5~95 or 45~75, while the weight percentage of the second material is in a range of 95~5 or 55~25, and the weight percentage of the third material in the second mixed material is in a range of 5~95 or 45~75, while the weight percentage of the fourth material is in a range of 95~5 or 55~25. Each of the first material and the third material is chosen from $AlQ_3$, ITO, IZO, AZO, FTO, ZnO, ZITO and GITO; or chosen from metallic oxides composed of at least two of In, Sn, Zn, Al, Fe and Ga; or chosen from Cs, Li, Na, K, Al, Ag, Ca, Li and Mg. Each of the second material and the fourth material is chosen from organic material or metallic oxide. For example, each of the second material and the fourth material may be chosen from $Alq_3$, Alq, MADN, TPBi, BCP, BPhen. The fourth material may be an electron transport material. By means of the first material layer 1071 made of the first mixed material and/or the second material layer 1073 made of the second mixed material, especially when the mixed material consists of metal and organic material, a material layer with good uniformity may be formed, while an affection of a relatively thick material layer on the penetrance and a sideward electrically conducting problem may be avoided.

According to some embodiments of the present disclosure, each of the first material layer 1071 and the second material layer 1073 has a thickness of less than 3 nm, for example, each of the first material layer 1071 and the second material layer 1073 has a thickness of approximately 0.5 nm. The electron injection layer 1072 may have a thickness of approximately 1 nm or of any other suitable values. By means of choosing suitable thickness of the various layers, a material layer with good uniformity may be formed, while an affection of a relatively thick material layer on the penetrance and a sideward electrically conducting problem may be avoided.

According to some embodiments of the present disclosure, as shown in FIG. 1, the light-emitting unit 103 may comprise an electron transport layer 1031, a light-emitting layer 1032 and a hole transport layer 1033, or comprise an electron injection layer, an electron transport layer 1031, a light-emitting layer 1032, a hole transport layer 1033 and a hole injection layer. The light-emitting unit 103 may be any suitable conventional light-emitting unit. The first electrode 101 and the second electrode 108 may be any suitable electrically conductive layer, including metal, metallic oxide or conductive polymer. One of the first electrode 101 and the second electrode 108 may be made of transparent conductive material, for example, the first electrode 101 is made of transparent conductive material.

According to some embodiments of the present disclosure, the electron injection layer 1072 is made of organometallic complex compound or inorganic material. According to other embodiments of the present disclosure, the electron injection layer 1072 is made of alkali metal compound. For example, the electron injection layer 1072 is made of one chosen from LiF, LiQ, NaF, CsF and $Cs_2CO_3$, or any other suitable materials.

According to the stacked organic light-emitting diode 100 of the embodiment of the present disclosure, the charge generation layer 107 comprises the electron injection layer 1072 disposed on the first material layer 1071 and the second material layer 1073 disposed on the electron injection layer 1072, therefore, the second material layer 1073 is manufactured after manufacturing the electron injection layer 1072. The heat energy generated during manufacturing of the second material layer 1073 enables the electron injection layer 1072 and the second material layer 1073 to produce chemical change, thereby causing the entire charge generation layer 107 to have more excellent electron injection effect. Therefore, it can enable the second material layer 1073 (for example, a metal layer or a mixed material layer) to react with the electron injection layer when manufacturing the stacked organic light-emitting diode, even in the case of manufacturing an inverted-type stacked organic light-emitting diode (the lower electrode is a cathode), thereby achieving excellent electron injection effect.

Figure 2:
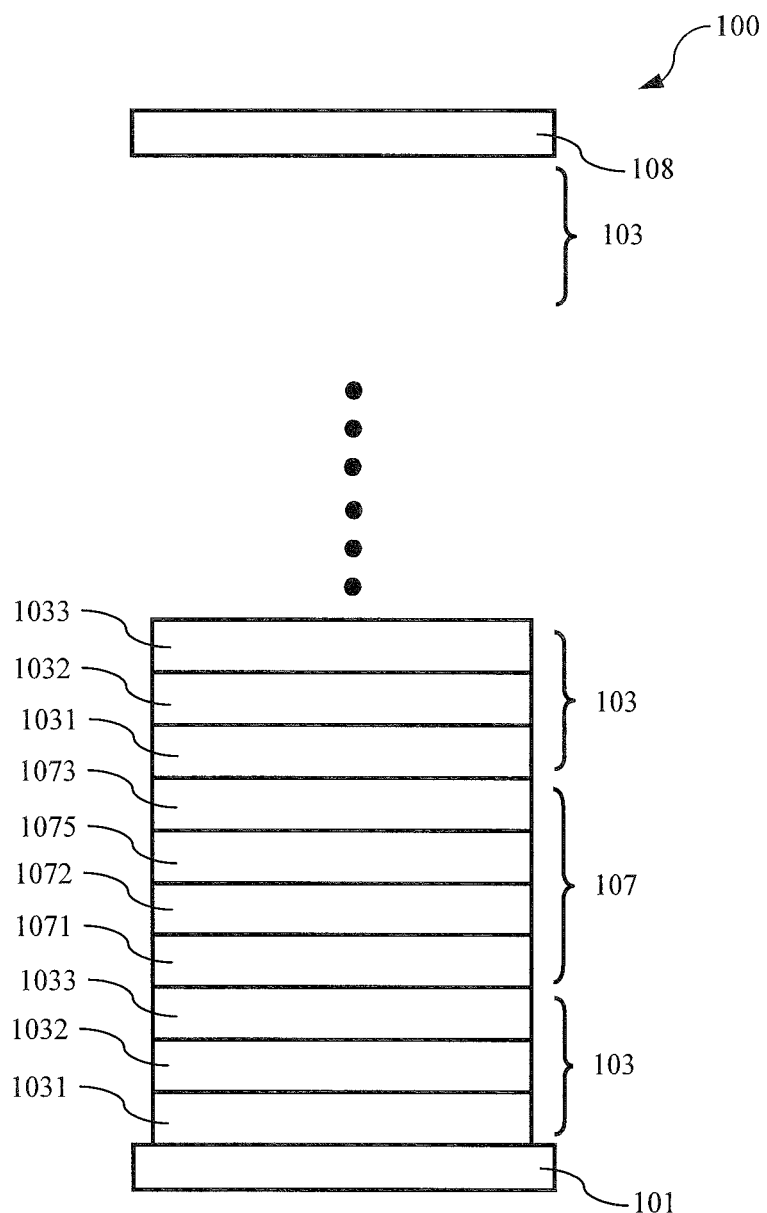
FIG. 2 is a schematic view of a stacked organic light-emitting diode according to another embodiment of the present disclosure.

FIG. 2 shows a schematic view of a stacked organic light-emitting diode according to another embodiment of the present disclosure. This embodiment differs from the above described embodiment in that: the stacked organic light-emitting diode 100 further comprises an organic layer 1075 disposed between the electron injection layer 1072 and the second material layer 1073 in the case that the second material layer 1073 is made of metal. According to some embodiments of the present disclosure, the organic layer 1075 is provided with a plurality of through-holes in a thickness direction, such that the second material layer 1073 and the electron injection layer 1072 may be locally directly contacted with each other. Thereby, the metal layer may react with the electron injection layer when manufacturing the stacked organic light-emitting diode. The organic layer 1075 may be made of one chosen from Alq, MADN, TPBi, BCP and BPhen, or any other suitable materials.

Based on the stacked organic light-emitting diode 100 according to the embodiment of the present disclosure, it can enable the second material layer 1073 to react with the electron injection layer when manufacturing the stacked organic light-emitting diode, even in the case of manufacturing an inverted-type stacked organic light-emitting diode (the lower electrode is a cathode), thereby achieving excellent electron injection effect. In addition, by means of the organic layer 1075 disposed between the electron injection layer 1072 and the second material layer 1073, the electron injection effect is further improved.

According to an embodiment of the present disclosure, there is provided a display device, comprising the stacked organic light-emitting diode 100 described above, for example, an organic light-emitting diode (OLED) display device.

As mentioned above, based on the stacked organic light-emitting diode 100 according to the embodiment of the present disclosure, it can enable the second material layer 1073 (for example, a metal layer of a mixed material layer) to react with the electron injection layer when manufacturing the stacked organic light-emitting diode, even in the case of manufacturing an inverted-type stacked organic light-emitting diode (the lower electrode is a cathode), thereby achieving excellent electron injection effect. Therefore, it may achieve a high-quality display device.

Next, a manufacturing method of a stacked organic light-emitting diode according to an embodiment of the present disclosure will be described.

Figure 3:
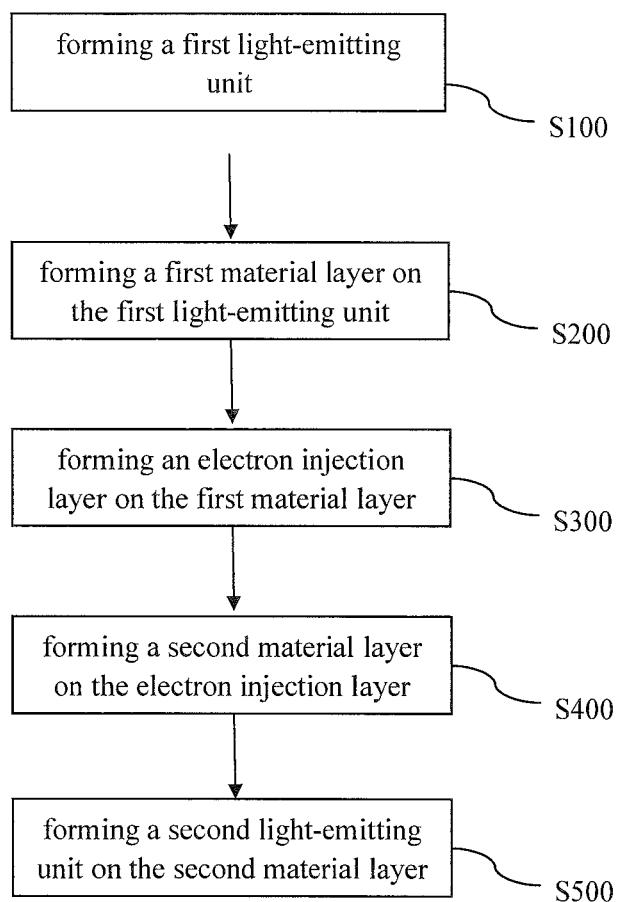
FIG. 3 is a flow chart of a manufacturing method of a stacked organic light-emitting diode according to an embodiment of the present disclosure.

FIG. 3 shows a flow chart of a manufacturing method of a stacked organic light-emitting diode according to an embodiment of the present disclosure. Referring to FIG. 3 in combination with FIGS. 1 and 2, the manufacturing method of the stacked organic light-emitting diode according to an embodiment of the present disclosure comprises steps of:

step S100: forming a first light-emitting unit 103;

step S200: forming a first material layer 1071 on the first light-emitting unit 103;

step S300: forming an electron injection layer 1072 on the first material layer 1071;

step S400: forming a second material layer 1073 on the electron injection layer 1072; and step S500: forming a second light-emitting unit 103 on the second material layer 1073.

The first material layer 1071, the electron injection layer 1072 and the second material layer 1073 compose a charge generation layer 107. The first material layer 1071 and the second material layer 1073 may be made of the same or different materials.

Referring to FIGS. 1 and 2, the manufacturing method of the stacked organic light-emitting diode according to the embodiment of the present disclosure may further comprise steps of: providing a substrate before forming the first light-emitting unit 103; and forming a first electrode 101 on the substrate. The step S100 of forming the first light-emitting unit 103 comprises forming the first light-emitting unit 103 on the first electrode 101.

According to some embodiments of the present disclosure, in the case that the second material layer 1073 is made of metal, the manufacturing method of the stacked organic light-emitting diode 100 further comprises a step of: forming an organic layer 1075, on which the second material layer 1073 is formed, on the electron injection layer 1072 after forming the electron injection layer 1072. The organic layer 1075 is provided with a plurality of through-holes in a thickness direction, such that the second material layer 1073 and the electron injection layer 1072 may be locally directly contacted with each other.

According to some embodiments of the present disclosure, the manufacturing method of the stacked organic light-emitting diode 100 further comprises a step of: forming a second electrode 108 on the uppermost light-emitting unit 103.

According to the embodiment of the present disclosure, the first electrode 101 is firstly formed, the light-emitting units 103 and the charge generation layers 107 are then formed alternately, a final light-emitting units 103 is then formed, and the second electrode 108 is formed on the uppermost light-emitting unit 103, as a result, the stacked organic light-emitting diode 100 is formed. The first electrode 101 may be one of a cathode and an anode, while the second electrode 108 may be the other of the cathode and the anode. By means of such charge generation layer 107 comprising the first material layer 1071, the electron injection layer 1072 and the second material layer 1073, it can achieve excellent electron injection effect.

According to some embodiments of the present disclosure, at least one of the first material layer 1071 and the second material layer 1073 is made of metal material. For example, the first material layer 1071 and the second material layer 1073 may be made of one chosen from Al, Ag, Mg, Au and Li, or any other suitable material. Based on the stacked organic light-emitting diode according to the embodiment of the present disclosure, since the second material layer 1073 is made of metal material, it can enable the material layer to react with the electron injection layer when manufacturing the stacked organic light-emitting diode, even in the case of manufacturing an inverted-type stacked organic light-emitting diode (the lower electrode is a cathode), thereby achieving excellent electron injection effect.

As an option, according to other embodiments of the present disclosure, the first material layer 1071 is made of a first mixed material, which is formed by mixing at least one first material having a first electrical conductivity and at least one second material having a second electrical conductivity, wherein the first electrical conductivity is greater than the second electrical conductivity, and/or the second material layer 1073 is made of a second mixed material, which is formed by mixing at least one third material having a third electrical conductivity and at least one fourth material having a fourth electrical conductivity, wherein the third electrical conductivity is greater than the fourth electrical conductivity. The first electrical conductivity may be greater than $10^3$ S/cm or $10^5$ S/cm, and the second electrical conductivity may be less than $10^{-6}$ S/cm, and the third electrical conductivity may be greater than $10^3$ S/cm or $10^5$ S/cm, and the fourth electrical conductivity may be less than $10^{-6}$ S/cm. The first material layer 1071 and the second material layer 1073 form an electrically conductive layer. According to an example of the present disclosure, the weight percentage of the first material in the first mixed material is in a range of 5~95 or 45~75, while the weight percentage of the second material is in a range of 95~5 or 55~25, and the weight percentage of the third material in the second mixed material is in a range of 5~95 or 45~75, while the weight percentage of the fourth material is in a range of 95~5 or 55~25. Each of the first material and the third material is chosen from $AlQ_3$, ITO, IZO, AZO, FTO, ZnO, ZITO and GITO; or chosen from metallic oxides composed of at least two of In, Sn, Zn, Al, Fe and Ga; or chosen from Cs, Li, Na, K, Al, Ag, Ca, Li and Mg. Each of the second material and the fourth material is chosen from organic material or metallic oxide. Each of the second material and the fourth material may be chosen from $Alq_3$, Alq, MADN, TPBi, BCP, BPhen. The fourth material may be an electron transport material. By means of the first material layer 1071 made of the first mixed material and/or the second material layer 1073 made of the second mixed material, especially when the mixed material consists of metal and organic material, a material layer with good uniformity may be formed, while an affection of a relatively thick material layer on the penetrance and a sideward electrically conducting problem may be avoided.

According to some embodiments of the present disclosure, the organic layer 1075 is made of one chosen from Alq, MADN, TPBi, BCP and BPhen, or any other suitable materials. The electron injection layer 1072 may be made of organometallic complex compound or inorganic material, or the electron injection layer 1072 is made of alkali metal compound. For example, the electron injection layer 1072 is made of one chosen from LiF, LiQ, NaF, CsF and $Cs_2CO_3$, or any other suitable materials.

Each of the first material layer 1071 and the second material layer 1073 may have a thickness of less than 3 nm, for example, each of the first material layer 1071 and the second material layer 1073 has a thickness of approximately 0.5 nm. The electron injection layer 1072 may have a thickness of approximately 1 nm or any other suitable thicknesses. By means of choosing suitable thickness of the various layers, a material layer with good uniformity may be formed, while an affection of a relatively thick material layer on the penetrance and a sideward electrically conducting problem may be avoided.

In an example of the present disclosure, referring to FIGS. 1 and 2, the stacked organic light-emitting diode 100 comprises: a substrate (not shown); a first electrode 101 disposed on the substrate, a light-emitting unit 103 (including an electron injection layer, an electron transport layer 1031, a light-emitting layer 1032, a hole transport layer 1033, a hole injection layer) disposed on the first electrode 101, a charge generation layer 107 (including a first material layer 1071 (Al, 0.5 nm thickness), an electron injection layer 1072 (LiQ, 1 nm thickness) disposed on the first material layer 1071 and a second material layer 1073 (Al, 0.5 nm thickness) disposed on the electron injection layer 1072) disposed on the light-emitting unit 103, a light-emitting unit 103, a charge generation layer 107, . . . , a light-emitting unit 103, a second electrode 108.

In an example of the present disclosure, referring to FIG. 1, the stacked organic light-emitting diode 100 comprises: a substrate (not shown); a first electrode 101 disposed on the substrate, a light-emitting unit 103 (including an electron injection layer, an electron transport layer 1031, a light-emitting layer 1032, a hole transport layer 1033, a hole injection layer) disposed on the first electrode 101, a charge generation layer 107 (including a first material layer 1071 (a mixture of MANN and Ag, 0.5 nm thickness), an electron injection layer 1072 (LiQ, 1 nm thickness) disposed on the first material layer 1071 and a second material layer 1073 (a mixture of $Alq_3$ and Al, 0.5 nm thickness) disposed on the electron injection layer 1072) disposed on the light-emitting unit 103, a light-emitting unit 103, a charge generation layer 107, . . . , a light-emitting unit 103, a second electrode 108.

As mentioned above, based on the manufacturing method of the stacked organic light-emitting diode 100 according to the embodiment of the present disclosure, by means of such charge generation layer comprising the first material layer, the electron injection layer and the second material layer, it can achieve excellent electron injection effect. Furthermore, based on the manufacturing method of the stacked organic light-emitting diode 100 according to the embodiment of the present disclosure, the second material layer 1073 is manufactured after manufacturing the electron injection layer 1072. The heat energy generated during manufacturing the second material layer 1073 enables the electron injection layer 1072 and the second material layer 1073 (a metal layer or a mixed material layer) to produce chemical change, thereby causing the entire charge generation layer 107 to have more excellent electron injection effect. Therefore, it can enable the second material layer 1073 (for example, a metal layer or a mixed material layer) to react with the electron injection layer when manufacturing the stacked organic light-emitting diode, even in the case of manufacturing an inverted-type stacked organic light-emitting diode (the lower electrode is a cathode), thereby achieving excellent electron injection effect. The manufacturing method of the stacked organic light-emitting diode 100 according to the embodiment of the present disclosure may be used in the manufacture of a usual stacked organic light-emitting diode (the lower electrode is an anode), furthermore, it may also be used in the manufacture of an inverted-type stacked organic light-emitting diode (the lower electrode is a cathode).

According to the embodiment of the present disclosure, in the case that the second material layer 1073 is made of metal, an organic layer 1075, on which the second material layer 1073 is formed, is formed on the electron injection layer 1072 after forming the electron injection layer 1072. As a result, the material of the electron injection layer may be reacted with the material of the organic layer, thereby generating more excellent electron injection effect.

The above embodiments are merely intended to describe the present disclosure, rather than limiting the present disclosure. Various changes and modifications may be made to the present disclosure by the person skilled in the art without departing from the spirit and scope of the present disclosure. Therefore, all equivalent technical solutions fall into the scope of the present disclosure, and the protection scope of the present disclosure is defined by the accompanying claims.

What is claimed is:

1. A stacked organic light-emitting diode, comprising:
    at least two light-emitting units in a stacked arrangement; and
    a charge generation layer disposed between the adjacent light-emitting units,
    wherein the charge generation layer comprises a first material layer, an electron injection layer disposed on the first material layer and a second material layer disposed on the electron injection layer.

2. The stacked organic light-emitting diode according to claim 1, wherein the first material layer is made of metal material, and/or the second material layer is made of metal material.

3. The stacked organic light-emitting diode according to claim 1, wherein the first material layer is made of a first mixed material, which is formed by mixing at least one first material having a first electrical conductivity and at least one second material having a second electrical conductivity, the first electrical conductivity being greater than the second electrical conductivity, and/or
    wherein the second material layer is made of a second mixed material, which is formed by mixing at least one third material having a third electrical conductivity and at least one fourth material having a fourth electrical conductivity, the third electrical conductivity being greater than the fourth electrical conductivity.

4. The stacked organic light-emitting diode according to claim 3, wherein the first electrical conductivity is greater than $10^3$ S/cm, and the second electrical conductivity is less than $10^{-6}$ S/cm, and/or
    wherein the third electrical conductivity is greater than $10^3$ S/cm, and the fourth electrical conductivity is less than $10^{-6}$ S/cm.

5. The stacked organic light-emitting diode according to claim 3, wherein the first material is a metal material and the second material is an organic material, and/or
    wherein the third material is a metal material and the fourth material is an organic material.

6. The stacked organic light-emitting diode according to claim 2, further comprising an organic layer disposed between the electron injection layer and the second material layer.

7. The stacked organic light-emitting diode according to claim 6, wherein the organic layer is provided with a plurality of through-holes in a thickness direction, such that the second material layer and the electron injection layer are locally directly contacted with each other.

8. The stacked organic light-emitting diode according to claim 6, wherein the organic layer is made of one chosen from Alq, MADN, TPBi, BCP and BPhen.

9. The stacked organic light-emitting diode according to claim 1, wherein each of the first material layer and the second material layer has a thickness of less than 3 nm.

10. The stacked organic light-emitting diode according to claim 1, wherein each of the first material layer and the second material layer has a thickness of approximately 0.5 nm.

11. The stacked organic light-emitting diode according to claim 1, wherein the first material layer and the second material layer are made of the same material.

12. The stacked organic light-emitting diode according to claim 2, wherein the first material layer and the second material layer are made of one chosen from Al, Ag, Mg, Au and Li.

13. The stacked organic light-emitting diode according to claim 1, wherein the electron injection layer has a thickness of approximately 1 nm.

14. The stacked organic light-emitting diode according to claim 1, wherein the electron injection layer is made of organometallic complex compound or inorganic material.

15. The stacked organic light-emitting diode according to claim 1, wherein the electron injection layer is made of alkali metal compound.

16. The stacked organic light-emitting diode according to claim 1, wherein the electron injection layer is made of one chosen from LiF, LiQ, NaF, CsF and $Cs_2CO_3$.

17. The stacked organic light-emitting diode according to claim 3, wherein the fourth material is an electron transport material.

18. The stacked organic light-emitting diode according to any one of claims 1-17, further comprising:
   a substrate;
   a first electrode disposed on the substrate, the at least two light-emitting units in a stacked arrangement being disposed on the first electrode, and the first electrode being a cathode.

19. A display device, comprising the stacked organic light-emitting diode according to claim 1.

* * * * *